United States Patent
Voss et al.

(10) Patent No.: US 9,490,318 B2
(45) Date of Patent: Nov. 8, 2016

(54) THREE DIMENSIONAL STRAINED SEMICONDUCTORS

(71) Applicant: Lawrence Livermore National Security, LLC, Livermore, CA (US)

(72) Inventors: Lars Voss, Livermore, CA (US); Adam Conway, Livermore, CA (US); Rebecca J. Nikolic, Oakland, CA (US); Cedric Rocha Leao, Oakland, CA (US); Qinghui Shao, Fremont, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 13/912,885

(22) Filed: Jun. 7, 2013

(65) Prior Publication Data

US 2013/0334541 A1    Dec. 19, 2013

Related U.S. Application Data

(60) Provisional application No. 61/660,580, filed on Jun. 15, 2012.

(51) Int. Cl.
| | |
|---|---|
| *H01L 29/06* | (2006.01) |
| *H01L 21/02* | (2006.01) |
| *H01L 29/861* | (2006.01) |
| *H01L 27/102* | (2006.01) |

(52) U.S. Cl.
CPC ..... *H01L 29/0657* (2013.01); *H01L 21/02107* (2013.01); *H01L 27/1021* (2013.01); *H01L 29/861* (2013.01)

(58) Field of Classification Search
CPC .......... H01L 27/1021; H01L 29/7847; H01L 29/1054; H01L 29/0657; H01L 29/861; H01L 21/02107

USPC ................. 257/77, 615, 618; 438/5
See application file for complete search history.

(56) References Cited

U.S. PATENT DOCUMENTS

| | | | |
|---|---|---|---|
| 2003/0032246 A1* | 2/2003 | Nagaya | H01L 25/0652 438/268 |
| 2004/0262692 A1* | 12/2004 | Hareland et al. | 257/369 |
| 2009/0075029 A1* | 3/2009 | Thomas | H01L 21/02381 428/173 |

(Continued)

OTHER PUBLICATIONS

Shaffler, F., "High-mobility Si and Ge structures," 1997 IOP Publishing Ltd., Semicond. Sci. Technol., vol. 12, No. 12, Dec. 1997, pp. 1515-1549.

(Continued)

*Primary Examiner* — Moazzam Hossain
(74) *Attorney, Agent, or Firm* — Zilka-Kotab, PC

(57) ABSTRACT

In one embodiment, an apparatus includes a three dimensional structure comprising a semiconductor material, and at least one thin film in contact with at least one exterior surface of the three dimensional structure for inducing a strain in the structure, the thin film being characterized as providing at least one of: an induced strain of at least 0.05%, and an induced strain in at least 5% of a volume of the three dimensional structure. In another embodiment, a method includes forming a three dimensional structure comprising a semiconductor material, and depositing at least one thin film on at least one surface of the three dimensional structure for inducing a strain in the structure, the thin film being characterized as providing at least one of: an induced strain of at least 0.05%, and an induced strain in at least 5% of a volume of the structure.

19 Claims, 11 Drawing Sheets

(56) References Cited

U.S. PATENT DOCUMENTS

| | | | | |
|---|---|---|---|---|
| 2009/0101420 | A1* | 4/2009 | Guerra | 180/65.21 |
| 2009/0242990 | A1* | 10/2009 | Saitoh et al. | 257/351 |
| 2010/0229929 | A1* | 9/2010 | Clifton | 136/255 |
| 2011/0117732 | A1* | 5/2011 | Bauer | H01L 21/02381 438/507 |
| 2012/0025312 | A1* | 2/2012 | Scheiper et al. | 257/347 |
| 2012/0091538 | A1* | 4/2012 | Lin et al. | 257/401 |
| 2012/0098050 | A1* | 4/2012 | Shim | H01L 27/11578 257/324 |
| 2013/0039664 | A1* | 2/2013 | Clifton | H01L 31/0352 398/200 |

OTHER PUBLICATIONS

O'Reilly et al., "Band-Structure Engineering in Strained Semiconductor Lasers," 1994 IEEE, IEEE Journal of Quantum Electronics, vol. 30, No. 2, Feb. 1994, pp. 366-379.

Sadowski et al., "Core/Shell CdSe/CdTe Heterostructure Nanowires Under Axial Strain," 2010 American Chemical Society, J. Phys. Chem. C., vol. 114, No. 4, Jan. 2010, pp. 1773-1781.

Vurgaftman et al., "Band parameters for III-V compound semiconductors and their alloys," 2001 American Institute of Physics, Journal of Applied Physics, vol. 89, No. 11, Jun. 1, 2001, pp. 5815-5875.

Wei et al., "Optical properties of zinc-blende semiconductor alloys: Effects of epitaxial strain and atomic ordering," 1994 The American Physical Society, Physical Review B, vol. 49, No. 20, May 1994, pp. 14337-14351.

Scholz, "Compound semiconductors: Physics, technology and device concepts (summer term 2009)," 2009, http://www-opto.e-technik.uni-ulm.de/lehre/cs/, pp. 1-2.

Kohn et al., "Self-Consistent Equations Including Exchange and Correlation Effects," Physical Review, vol. 140, No. 4A, Nov. 15, 1965, pp. A1133-A1138.

Van De Walle et al., "'Absolute' Deformation Potentials: Formulation and ab-Initio Calculations for Semiconductors," 1989 The American Phsyical Society, Physical Review Letters, vol. 62, No. 17, Apr. 24, 1989, pp. 2028-2031.

Noffsinger et al., "EPW: A program for calculating the electron-phonon coupling using maximally localized Wannier Functions," 2010 Elsevier B.V., Computer Physics Communications, vol. 181, 2010, pp. 2140-2148.

Nikolic et al., "Scalable Solid State Pillar Structured Thermal Neutron Detectors," Quarterly Progress Report to DNDO, Mar. 2011, pp. 1-60.

* cited by examiner

THREE DIMENSIONAL STRAINED SEMICONDUCTORS

RELATED APPLICATIONS

This application claims priority to U.S. Provisional Application No. 61/660,580 filed Jun. 15, 2012, the contents of which are herein incorporated by reference.

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to semiconductors, and more particularly to the three dimensional strained semiconductors and methods of making the same.

BACKGROUND

Semiconductors have enabled nearly all electronics (e.g. transistors, diodes, etc), communication systems, optoelectronics (e.g. light emitting diodes, laser diodes, photodetectors), photovoltaics, sensors, and other such applications. This is due to their unique place between insulators and conductors, and the corresponding ability to switch, produce gain, and emit light.

The electronic properties of semiconductors arise from their crystalline lattice, with the regular order giving rise distinct energy bands of allowed energy states separated by forbidden gaps. The nature of this forbidden gap, or band gap, is the key parameter which dictates what applications a particular semiconductor is suited for; it controls whether the semiconductor emits light (direct vs. indirect transition) and at what wavelength, as well as the charge carrier concentration and carrier mobility. FIG. 1 provides an illustrative plot of intrinsic carrier concentration versus band gap energy. FIG. 2 provides another illustrative plot of wavelength versus band gap energy.

Modifying the atomic spacing/composition of the semiconductors and/or externally applying strain to the semiconductors may allow tuning of fundamental physical and electronic properties of semiconductors (e.g. band gap, carrier mobility, density of states, emission wavelength, optical absorption, etc.). For example, externally applying strain may improve semiconductor device performance by enhancing the electron mobility for transistors, modifying states for lasers, enabling faster transistor switching speeds and tuning photon absorption properties. FIGS. 3A and 3B provide schematics of conventional two dimensional planar semiconductor devices comprising an unstrained direct band gap semiconductor 302 and a strained direct band gap semiconductor 304, respectively.

Conventional techniques for applying strain to semiconductors typically rely on interfacial lattice mismatch, thus limiting the applied strain to the interfacial or near interfacial regions. Moreover, utilization of these conventional techniques strongly couples the applied strain to the choice of semiconductor materials. For instance, to achieve a desired strain a specific combination of semiconductors must be used, which will ultimately dictate the fundamental properties of the resulting device. A large share of current semiconductor technology involves the use of the following semiconductor material systems: Si/SiGe, SiC, GaAs/AlGaAs, GaN/AlGaN, InP/InGaAsP etc. However, manufacture of these heterostructures requires advanced high vacuum deposition methods (e.g. metallorganic chemical vapor deposition (MOCVD) and molecular beam epitaxy (MBE)), which contribute greatly to the overall cost in device manufacturing.

Accordingly, conventional strained semiconductor technology is limited in the materials that can be used and the volume of material that can be strained.

SUMMARY

According to one embodiment, an apparatus includes a three dimensional structure comprising a semiconductor material, and at least one thin film in contact with at least one exterior surface of the three dimensional structure for inducing a strain in the structure, the at least one thin film being characterized as providing at least one of: an induced strain of at least 0.05%, and an induced strain in at least 5% of a volume of the three dimensional structure.

According to another embodiment, a method includes forming a three dimensional structure comprising a semiconductor material, and depositing at least one thin film on at least one surface of the three dimensional structure for inducing a strain in the structure, the at least one thin film being characterized as providing at least one of: an induced strain of at least 0.05%, and an induced strain in at least 5% of a volume of the structure.

Other aspects and embodiments of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, reference should be made to the following detailed description read in conjunction with the accompanying drawings.

DETAILED DESCRIPTION

Figure 1:
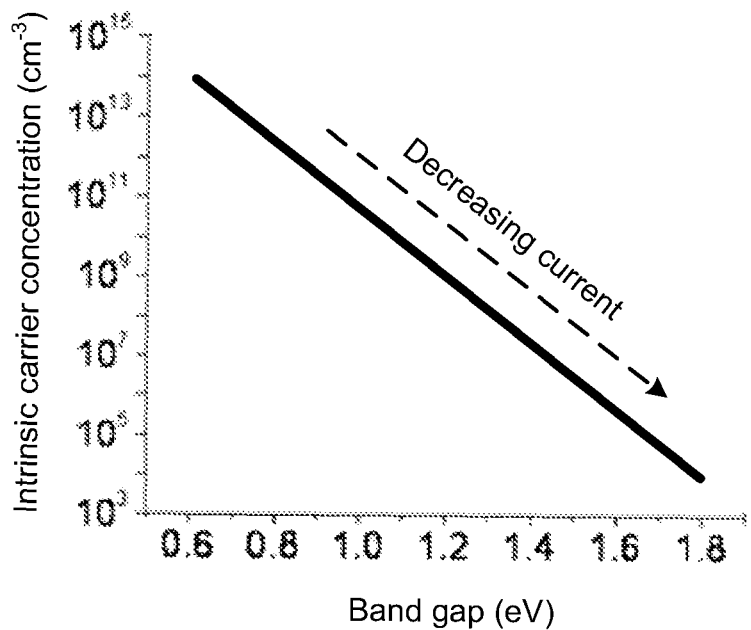
FIG. 1 shows a plot of intrinsic carrier concentration versus band gap energy for a generic semiconductor.
Figure 2:
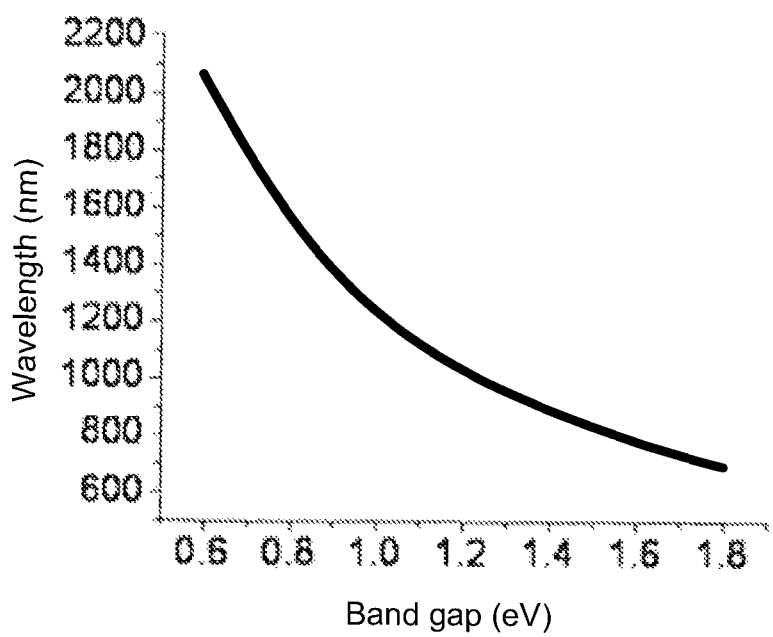
FIG. 2 shows a plot of wavelength versus band gap energy, which is material independent.
Figure 3A:
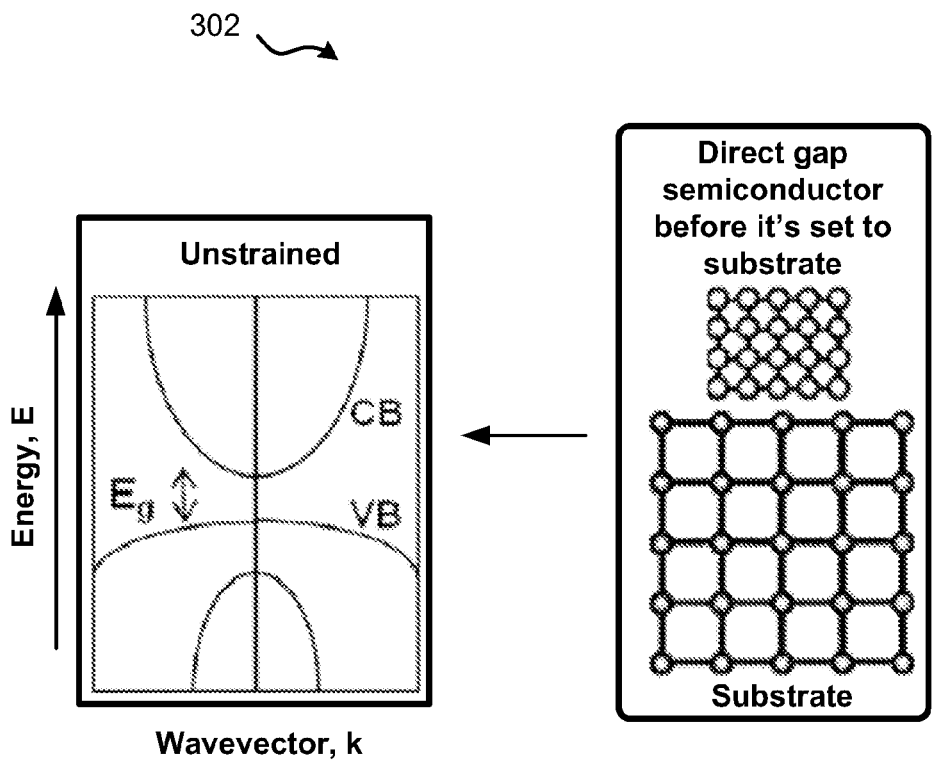
FIG. 3A shows a schematic diagram of a conventional two dimensional unstrained semiconductor device.
Figure 3B:
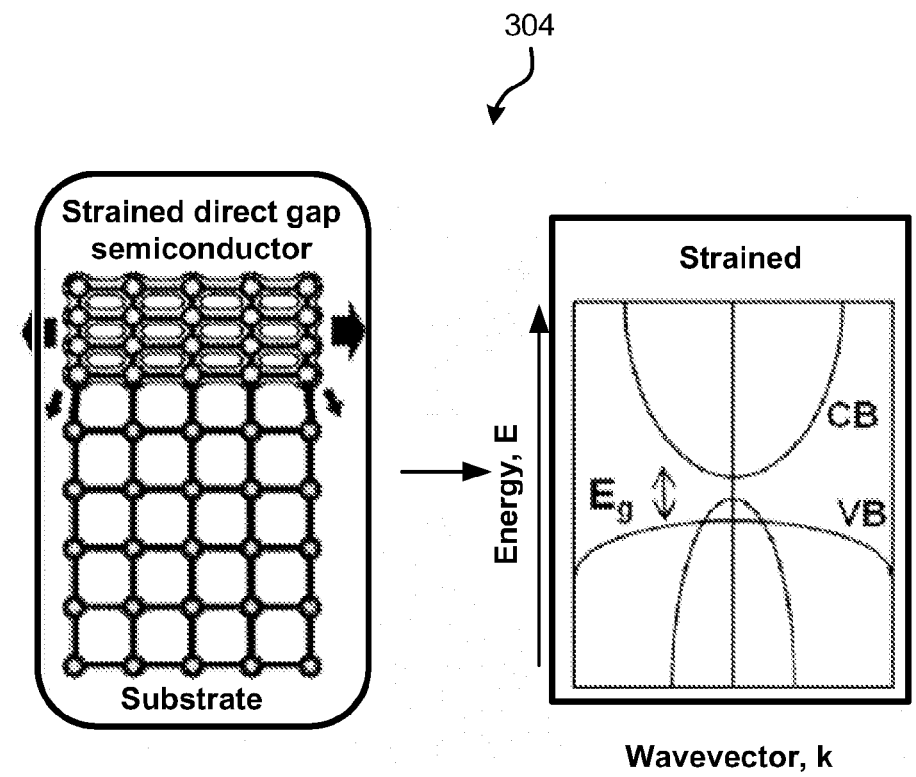
FIG. 3B shows schematic diagram of a conventional two dimensional strained semiconductor device.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of semiconductor materials in three dimensional strained configurations and/or related systems and methods.

In one general embodiment, an apparatus includes a three dimensional structure comprising a semiconductor material, and at least one thin film in contact with at least one exterior surface of the three dimensional structure for inducing a strain in the structure. The at least one thin film is characterized as providing at least one of: an induced strain of at least 0.05%, and an induced strain in at least 5% of a volume of the three dimensional structure.

In another general embodiment, a method includes forming a three dimensional structure comprising a semiconductor material, and depositing at least one thin film on at least one surface of the three dimensional structure for inducing a strain in the structure. The at least one thin film is characterized as providing at least one of: an induced strain of at least 0.05%, and an induced strain in at least 5% of a volume of the structure.

As used herein, the term "strain" refers to an amount of deformation of a body/structure/material due to an applied force. Specifically, strain may be defined as the fractional change in length, volume, etc. and may be positive (tensile) or negative (compressive). For example, the amount of volumetric strain, $\in$, may be represented by the formula: $\in = \Delta V/V$, where $\Delta V$ is the change in volume, and V is the total volume. Strain may also be expressed as a percent strain. For instance, a 5% strain may refer to a 5% change in length, volume (or desired unit of measurement).

As also used herein, the term "about" when combined with a value refers to plus and minus 10% of the reference value. For example, a length of about 1000 nm refers to a length of 1000 nm±100 nm, a temperature of about 50° C. refers to a temperature of 50° C.±5° C., etc.

As noted above, conventional strained semiconductor technology is limited with regard to the material that can be used and the volume of material that can be strained. For example, application of strain to semiconductor devices via such conventional technology relies on interfacial lattice mismatch. Accordingly, the applied strain is limited to the interfacial or near-interfacial regions and is strongly coupled to the choice of semiconductor material. Typical strained semiconductor devices are generally comprised of mixed materials (e.g. heterostructures) such as Si, GaAs/AlGaAs, GaN/AlGaN, Si/SiGe, etc. However, fabrication of these mixed materials systems often involves expensive high vacuum deposition systems. Moreover, lattice mismatch in such semiconductor devices is only capable of achieving strains less than 1%.

Figure 4:
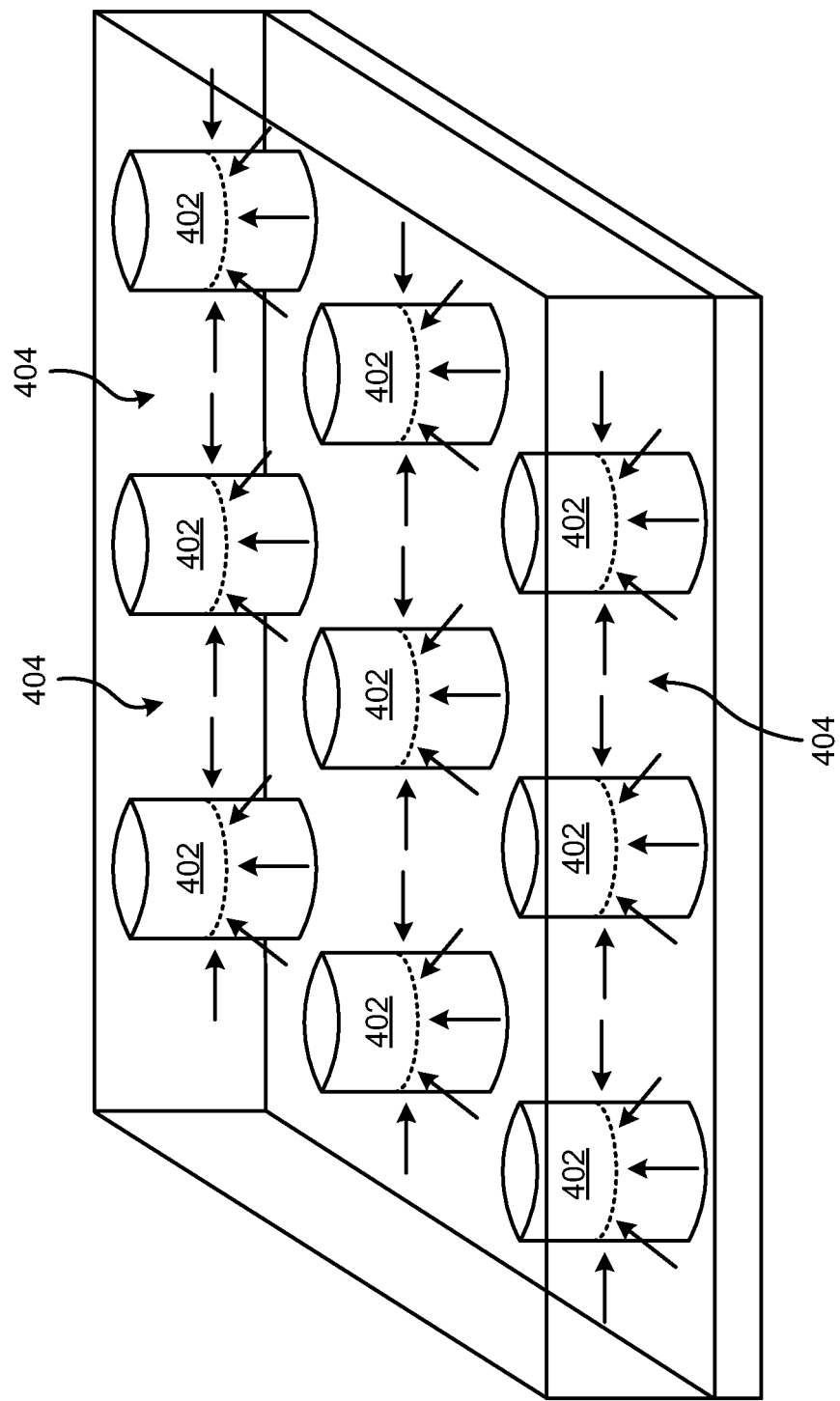
FIG. 4 provides a schematic diagram of an array of strained three dimensional pillars, according to one embodiment.

Various embodiments disclosed herein overcome the aforementioned drawbacks by providing three dimensional structures comprising semiconductor material(s) and externally applied strain in the form of a coating (e.g. a thin film) in order to achieve high strains over bulk regions of the semiconductor. FIG. 4 provides a schematic diagram illustrating an array of strained three dimensional pillars 402 with cavity regions 404 therebetween, according to one approach. It is important to note that the three dimensional structures disclosed herein are not limited to pillars as shown in FIG. 4, but rather may comprise ridges or other such suitable three dimensional structure as would be understood by one having skill in the art upon reading the present disclosure.

By fabricating and utilizing three dimensional strained semiconductor/film structures such as those disclosed in various embodiments herein, far higher strains on far greater volumes of material may be achieved relative to using conventional two dimensional devices. For example, instead of relying on interfacial lattice mismatch, the strain may be generated by intrinsic thin film stresses, which may arise from one or more deposition conditions. Where thin films are deposited on conventional two dimensional structures, e.g. flat wafers, the film thickness is typically constrained by the accumulated intrinsic stresses, which ultimately causes films to delaminate from substrates. However, three dimensional structures, such as those disclosed herein, may spatially constrain the thin film coating, thus preventing delamination. In some approaches, a film with a thickness ranging from about 10 nm to at least several microns may be deposited on the disclosed three dimensional structures. In more approaches, one or more deposition conditions (e.g. a deposition time, temperature, pressure, hydrogen content in the thin film, etc.) may be modified to increase or decrease the amount of intrinsic stress in the thin film coating, thereby increasing or decreasing the amount of strain applied to the three dimensional structures.

Figure 5:
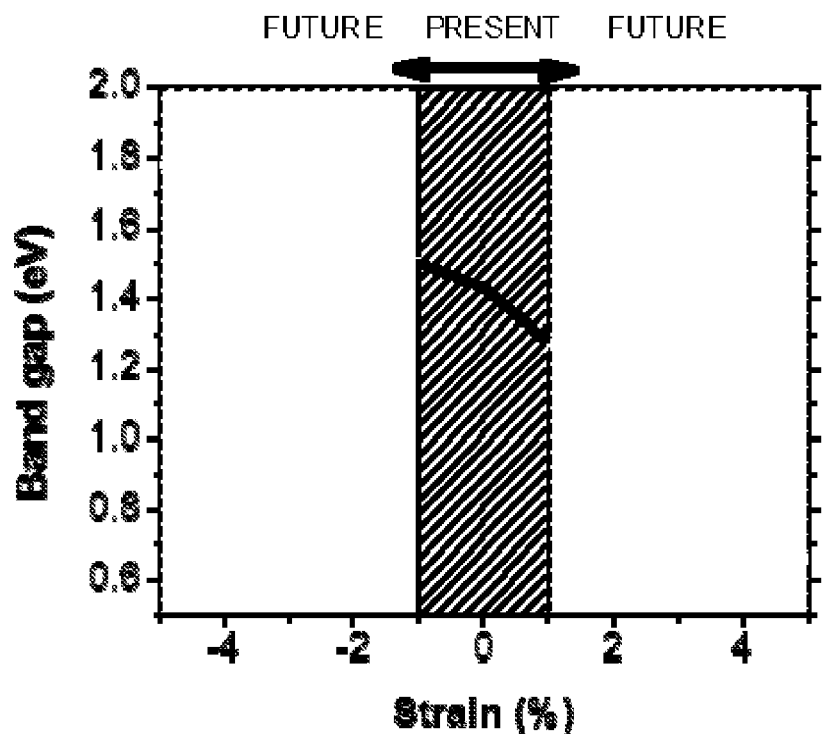
FIG. 5 shows a plot of band gap versus strain for GaAs.

Another advantage of three dimensional strained semiconductor/film structures is that because the strain originates externally, it affects the entire volume of the semiconductor rather than only at an interface of a lattice mismatch as in conventional devices, which induces only a local stress. This may allow for direct control/tenability of fundamental physical, mechanical, and electrical properties (e.g. band gap, carrier mobility, density of states, emission wavelength, optical absorption, etc.) in a bulk of the three dimensional semiconductor material rather than merely at interfacial regions. For example, FIG. 5 provides a plot illustrating the change in band gap versus applied strain for three dimensional structure comprising GaAs.

Additionally, various embodiments disclosed herein may also allow for complete decoupling of the applied strain from the choice of semiconductor material(s), allowing any desired, achievable strain to be achieved on a given semiconductor. Finally, the approaches discussed herein may allow for the use and/or fabrication of multi band gap devices using a single semiconductor material.

Several exemplary advantages of the three dimensional strained semiconductor/film structures disclosed herein relative to conventional strained devices are presented in Table 1.

TABLE 1

Comparison of conventional strained semiconductor devices and three dimensional strained semiconductor/film devices/structures.

|  | Conventional strained devices | Three dimensional strained semiconductor/film structures |
| --- | --- | --- |
| Source of strain | Internal lattice mismatch | External thin film intrinsic stress |
| Device structure | Heterostructure | Any 3D device |
| Affected volume | Small; interfacial region | Large; volumetric |
| Semiconductor choices | Limited | Unlimited |

Figure 6:
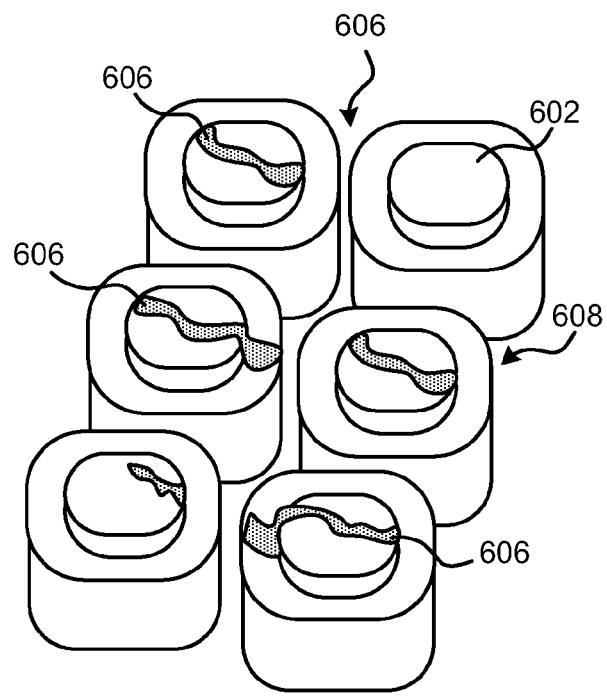
FIG. 6 provides a schematic diagram of an array of fractured (e.g. overstrained) three dimensional silicon pillars, according to one embodiment.

In some embodiments, application of thin films to a three dimensional structure comprising semiconductor material(s) may induced strains in the structure up to about 5%, exceeding that typically achieved with lattice mismatch, which is less than 1%. In other embodiments, application of thin films to a three dimensional structure comprising semiconductor material(s) may induce strains in the structure from about zero to about a fracture point of the structure. FIG. 6 provides a top down view of a schematic of three dimensional silicon pillars 602 with cavity regions therebetween 604 that have been cracked (e.g. that comprise one or more fractures 606) due to induced strain originating from an external thin film 608. Again it is important to note that the three dimensional structures disclosed in numerous embodiments herein, are not limited to a pillar shape or limited to a silicon material as shown in FIG. 6. For instance, these three dimensional structures may comprise any suitable three dimensional shape (e.g. a pillar, a ridge, etc.) as well as any suitable semiconductor material, including but not limited to Si, Ge, GaAs, CdTe, etc. Moreover, the three dimensional structures comprising semiconductor material(s) may or may not be included in an array of three dimensional structures in some approaches.

Figure 7A:
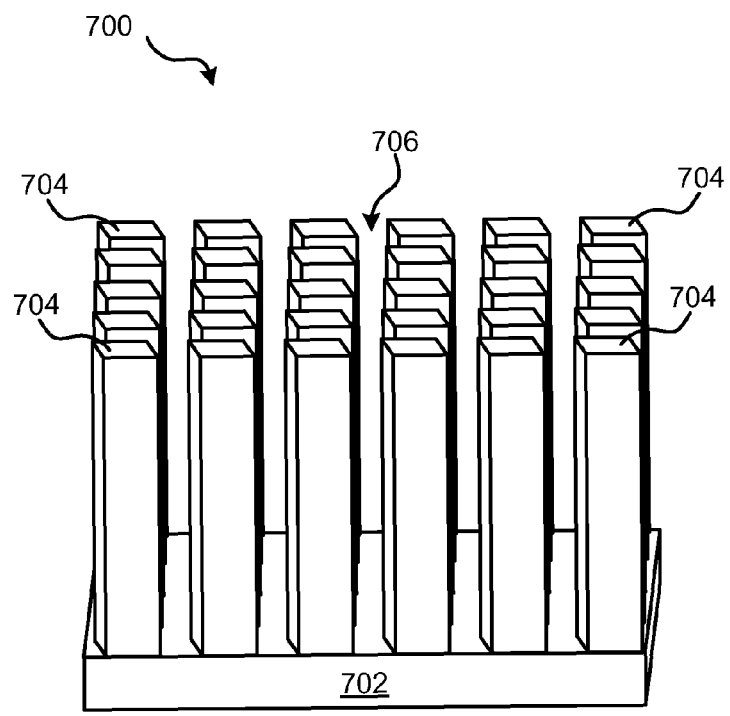
FIG. 7A shows a schematic diagram of a structure including an array of three dimensional pillars, according to one embodiment
Figure 7B:
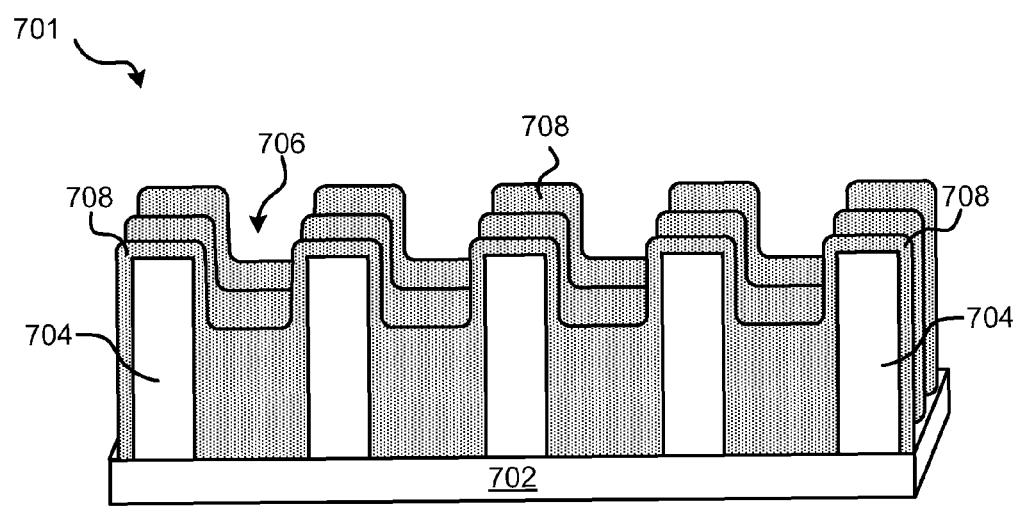
FIG. 7B shows a schematic diagram of a structure including an array of three dimensional pillars with a coating located in cavity regions between each of the pillars, according to one embodiment.

FIGS. 7A and 7B depict structures 700 and 701, respectively, including arrays of three dimensional pillars, in accordance with one embodiment. As an option, the present structures 700 and 701 may be implemented in conjunction with features from any other embodiment listed herein, such as those described with reference to the other FIGS. Of course, such structures 700 and 701, and others presented herein, may be used in various applications and/or in permutations, which may or may not be specifically described in the illustrative embodiments listed herein.

As shown in FIG. 7A according to one approach, a substrate 702 is etched to form an array of pillars 704 with cavity regions 706 between each of the pillars. The substrate may include, but is not limited to, a semiconductor material, silicon, etc. or other suitable substrates as would be understood by one skilled in the art upon reading the present disclosure. For instance, in one embodiment, the substrate may include a crystalline semiconductor material. In yet other embodiments, the substrate material may include a semiconductor material selected from the group consisting of: Si, SiC, GaAs, AlGaAs, GaN, AlGaN, etc.

In some approaches, an upper portion of each of the pillars 704 may include a $p^+$ layer (not shown in FIG. 7A), where the upper portion of each of the pillars 704 is positioned away from the substrate 702. In additional approaches, the substrate 702 may serve as an $n^+$ layer, such that the array of pillars on the substrate forms a p-n or p-i-n diode array. In more approaches, an upper portion of each of the pillars 704 may include an $n^+$ layer (not shown in FIG. 7A) and the substrate may serve as a $p^+$ layer. A high doping layer may be applied to cover the top layer of the pillars, and/or to cover all surfaces of the pillars, etc., in various approaches. Additionally, an electrode may be coupled to the upper and/or lower surfaces of the three dimensional pillar structures to promote the collection of the electrical signals generated by movement of charge carriers, e.g. electron-hole pairs, in other approaches. Processing hardware of a type known in the art may also be coupled to these electrodes for detecting, processing, etc. of generated electrical signals in more approaches. Any known detector components (e.g. pre-amplifiers, amplifiers, multi-channel analyzers, computers, etc.) may be used in combination with the novel structures presented herein, according to even more approaches.

In numerous approaches, the pillars 704 may have a high aspect ratio. For example, the aspect ratio of the pillars 704, defined as the ratio of the height of the pillars relative to its width and/or pitch, may be in a range of about 1:1 to about 1000:1 or higher, e.g., about 1:1, about 10:1, about 25:1, about 50:1, and about 100:1.

In further approaches, each of the pillars 704 in the array may also have a diameter, d, of about 10 nm to about 5 μm in some approaches. In addition, each of the pillars may have a pitch, p, of about 10 nm to about 10 μm and a height (e.g. an etch depth), h, of about 10 nm to about 100 μm, e.g., about 10 nm, about 50 nm, about 4 μm, about 10 μm, about 12 μm, about 20 μm, about 50 μm, or about 100 μm, in more approaches. Further, the separation, s, between adjacent pillars may be in a range from about a few nanometers to about 10 μm. It is important to note, however, that said pillar dimensions (diameter, pitch, height, aspect ratio, etc.) serve only as an example and are not limiting in any way, and various embodiments may have larger or smaller dimensions.

As depicted in FIG. 7B, a coating (e.g. a thin film) is deposited in the cavity regions 706 between each pillar 704 in the array. The coating 708 may be an atomic or molecular medium, a polymer, semiconductor, dielectric, non-crystalline (e.g. polycrystalline, amorphous), a metal, etc. In some embodiment, the coating 708 may comprise a metal that serves both as an electrode and a source of strain. In preferred embodiments, the coating 708 may comprise $SiO_2$, $SiN_x$, $SiO_xN_y$, B, etc. or other such suitable material as would be understood by one having skill in the art upon reading the present disclosure. Additionally, in some approaches, the coating 708 may have a thickness of greater than about 100 angstroms. In other approaches, the coating 708 may have a thickness in range between about 100 angstroms to about 5 μm.

In numerous approaches, the coating 708 may have a physical characteristic of inducing a volumetric strain in the pillar 704. For example, in one embodiment, the coating 708 may have a physical characteristic of inducing a volumetric strain of at least 0.05% in each of the pillars 704. In another embodiment, the induced strain may be between about 2% to about 5%. In yet another embodiment, the induced volumetric strain may be within 10% of a fracture point of each of the pillars 704. In more embodiments, the induced strain may range from about zero to about the fracture point of each of the pillars 704.

Further, in other approaches, the induced strain may be in at least 5% of a volume of each of the pillars 704. According to one embodiment, the induced strain may be in at least 10%, 25% to about 90% or greater of the volume of each of the pillars 704. According to another embodiment, the induced strain may be in at least 75%, in at least 90%, in at least 95%, etc. of the volume of each of the pillars 704.

In numerous approaches, the coating 708 may comprise an intrinsic stress arising from one more deposition conditions, including but not limited to a deposition temperature, a deposition pressure, a deposition time, a type of deposition method, a stoichiometry of the deposited coating, RF power, concentration of one or more backflowing gases, dopants in the film such as H or C, etc. In one approach, the coating 708 may comprise an intrinsic stress greater than about 0.1 GPa. In another approach, the coating 708 may comprise an intrinsic stress from about 0.1 GPa to about 5 GPa. In yet another approaches, the coating may comprises an intrinsic stress greater than about 5 GPa. In some approaches the intrinsic stress of the coating 708 may induce the volumetric strain in each of the pillars 704.

A second material, not shown in FIG. 7B, may also fill the cavity regions 706. In some approaches, the second material may provide stability for the array and may or may not possess intrinsic stresses and/or contribute to the volumetric strain induced in the pillars 704. For example, the second material may include a non-rigid material, a polymer, etc.

The structures 700 and 701 may also include a coating of a functional or support material (not shown in FIG. 7A or 7B) deposited on the bottom surface of the substrate 702 and/or atop the pillar array. As an example, this coating may be metallic to form electrical contacts, e.g. electrodes, to serve as a sensor or detector. For instance, in one approach, aluminum may be sputtered on the bottom surface of the substrate 702 and/or atop the pillar array to form the electrodes.

Figure 8:
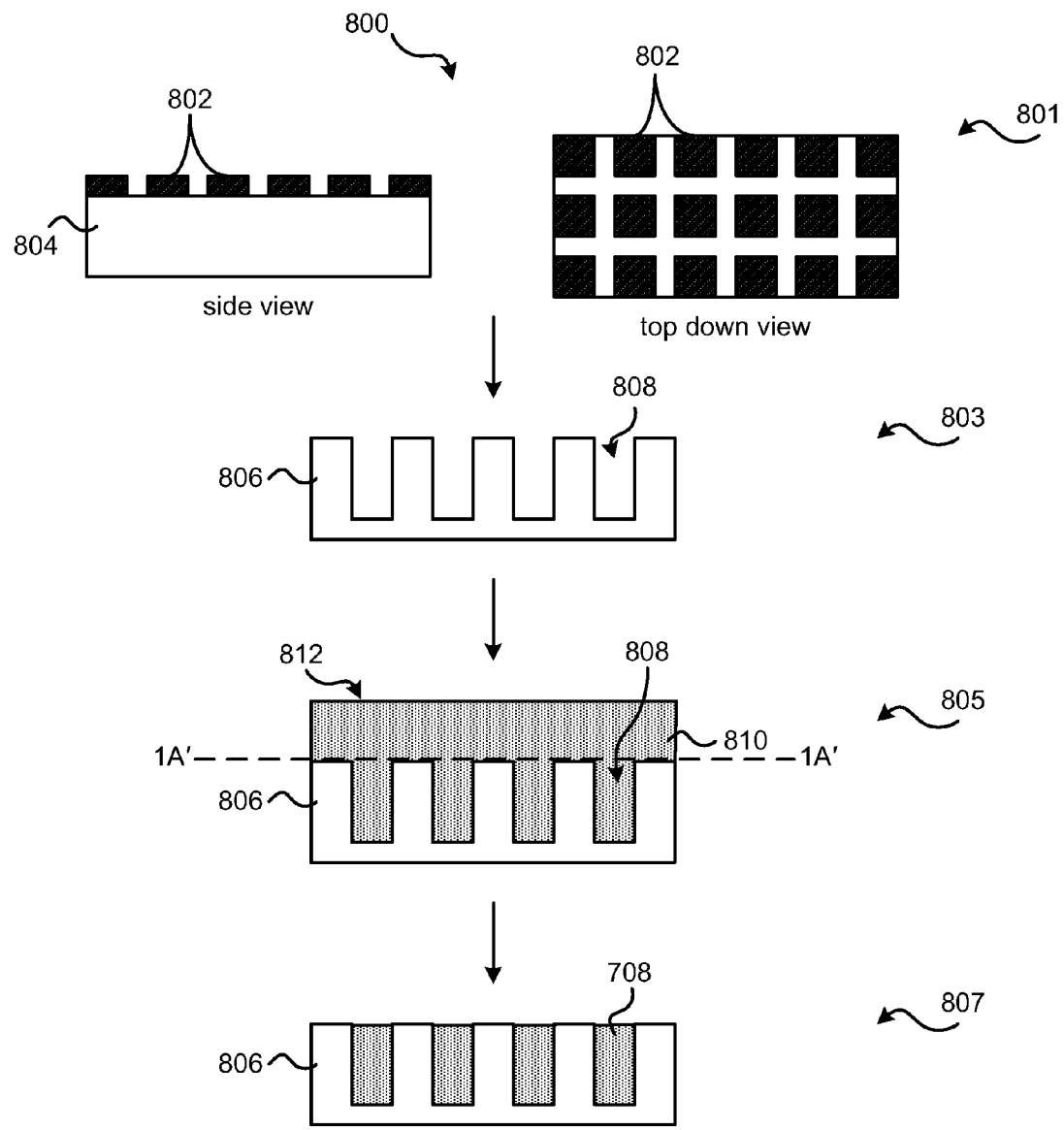
FIG. 8 shows a flowchart of a method for fabricating an array of three dimensional structures, according to one embodiment.

Referring now to FIG. 8, an exemplary method 800 for fabricating an array of three dimensional structures is shown according to one embodiment. As an option, the present method 800 may be implemented in conjunction with features from any other embodiment listed herein, such as those described with reference to the other FIGS. Of course, however, such method 800 and others presented herein may be used in various applications and/or in permutations, which may or may not be specifically described in the illustrative embodiments listed herein. Moreover, more or less operations than those shown in FIG. 8 may be included in method 800, according to various embodiments. Furthermore, while exemplary processing techniques are presented, other known processing techniques may be used for various steps.

As shown in FIG. 8, a photolithographic mask 802 is applied to a substrate 804. In some approaches, the substrate 804 may comprise a semiconductor material having a crystalline structure. In more approaches, the substrate 804 may comprise one or more semiconductor materials including, but not limited to, Si, Ge, GaAs, AlGaAs, GaN, AlGaN, CdTe, or other such suitable semiconductor materials as would be understood by one having skill in the art upon reading the present disclosure.

With continued reference to FIG. 8, the substrate 804 is then etched to form an array of three dimensional structures 806, e.g. pillars, with the array pattern defined by the photolithographic mask 802. See transition from structure 801 to structure 803. Cavity regions 808 are present between each of the three dimensional structures 806. Etching the substrate 804 may include such techniques as dry etching by high density plasma (e.g. reactive ion etching), wet etching with or without using a surfactant, etc. Additionally, if the substrate 804 has been etched using a high density plasma etch, an optional step may include further wet etching the pillar surfaces using a surfactant or other etches that etch the semiconductor material in order to remove any plasma etch damage. Surfactants used during the wet etching may include ammonium fluoro alkyl sulfonamide in water or potassium hydroxide with isopropyl alcohol.

After the three dimensional structures 806 have been formed, a thin film 810 is deposited into the cavity regions 808 between each of the pillars 806 resulting in structure 805. The thin film 810 may be deposited via chemical vapor deposition (CVD), low pressure CVD, plasma-enhanced CVD, evaporation, sputtering, etc. or other suitable deposition method known in the art.

In some approaches, an upper surface 812 of the thin film 810 may lie substantially along or above a plane defined by line 1A'. In approaches where the upper surface 812 of the thin film 810 extends substantially along or above the plane defined by line 1A', the thin film may be etched back so that at least a section of an upper portion of the three dimensional structures 806 is exposed, where the upper portion of each of the pillars is positioned away from the substrate. See resulting structure 807. Etching back the thin film 810 may be achieved using such techniques as plasma beam etching, ion beam etching, lapping, applying an adhesive to delaminate or "tear off" the top layer, etc.

In various approaches, after etching back the thin film 810, the thickness of the remaining thin film 810 may be less than or equal to the height of the three dimensional structures 806, where the thickness of the thin film is measured parallel to the longitudinal axis of the respective material. For example is some approaches, the thickness of the thin film 810 may be between about 2 µm to 100 µm, e.g. about 50 µm, etc.

In other approaches, the deposition of the thin film 810 may be stopped such that the array of three dimensional structures is under-filled. Consequently, the thin film 810 may not completely fill the cavity regions 808, thereby defining gaps in the cavity regions 808 that are not filled with the thin film 810. Further, said gaps between the thin film 810 and at least an upper portion of each three dimensional structure (e.g. the region positioned away from the substrate 804) may exhibit a physical characteristic of altering an induced volumetric strain (e.g. a tensile and/or compressive strain) in the three dimensional structures 806 in various approaches.

Figure 9A:
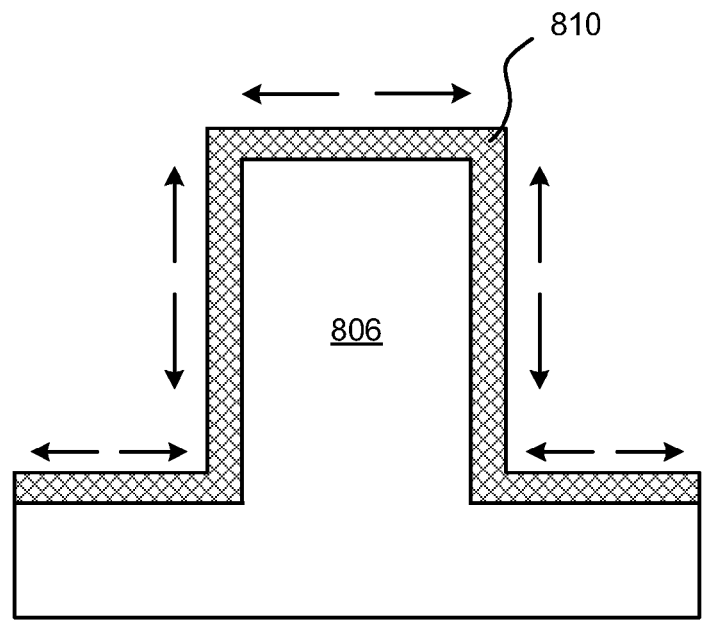
FIG. 9A shows a schematic diagram of a three dimensional structure subject to a tensile strain.
Figure 9B:
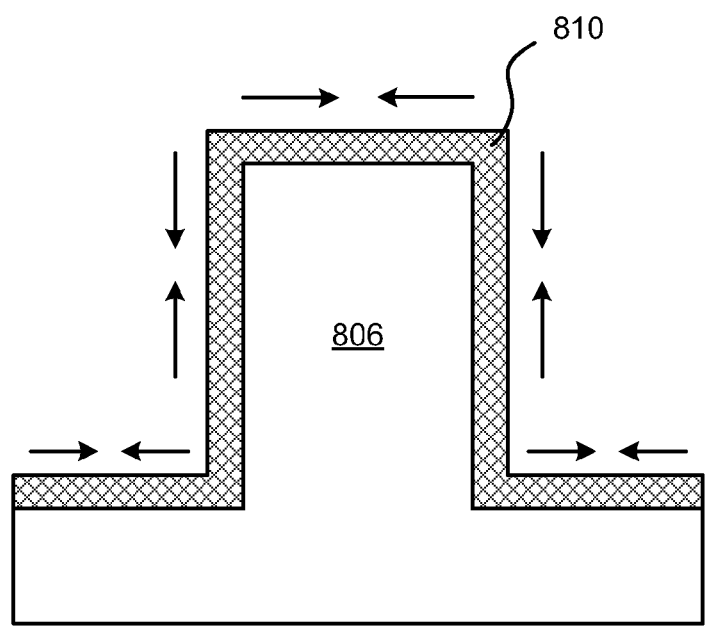
FIG. 9B shows a schematic diagram of a three dimensional structure subject to a compressive strain.

In more approaches, the thin film 810 may be characterized as providing/inducing a volumetric strain in each of the three dimensional structures 806. The induced strain may result via differences in the thermal expansion coefficients of the materials of the thin film and three dimensional structures, via internal stresses of the thin film, etc. FIG. 9A provides a schematic of a three dimensional structure 806 with a thin film 810 thereon, where the three dimensional structure 806 is subject to a tensile stress (as indicated by the illustrative arrows). In contrast, FIG. 9B provides a schematic of a three dimensional structure 806 with a thin film 810 thereon, where the three dimensional structure 806 is subject to a compressive stress (as indicated by the illustrative arrows).

With continued reference to FIG. 8, one or more conditions during the deposition, e.g. chemical vapor deposition, of the thin film 810 may be modified to alter an intrinsic stress of the thin film 810 in yet other approaches. Said deposition conditions may include, but are not limited to, temperature, pressure, time, RF power, concentration of one or more backflowing gases, a stoichiometry of the deposited coating, a hydrogen content in the thin film, the selected deposition method, etc.

According to one embodiment, the thin film 810 may comprises a non-crystalline material. For instance, in some approaches, the thin film 810 may be an amorphous material or a polycrystalline material.

According to another embodiment, the thin film 810 may comprise a dielectric material. Suitable dielectric materials may include, but are not limited to, $SiO_2$, $SiN_x$, $SiO_xN_y$, B, and combinations thereof. Table 2 provides several intrinsic stress values for several exemplary thin film materials deposited via several exemplary deposition techniques.

TABLE 2

Intrinsic stress values for several exemplary thin film materials deposited via exemplary deposition techniques.

| Coating (e.g. thin film) | Deposition process | Deposition conditions | Stress (GPa) |
|---|---|---|---|
| $SiO_2$ | Thermal | 900-1200° C. | −0.2 to −0.03 |
| $SiO_2$ | CVD | 40 nm/min, 400° C. | 0.13 |
| $SiO_2$ | $SiH_4 + O_2$ | 400 nm/min | 0.38 |
| $SiO_2$ | Sputtered | | −.15 |
| $Si_3N_4$ | CVD | 450-900° C. | 1.2 |
| $Si_3N_4$ | PECVD 13.56 MHz | 400° C. | −0.7 |
| $Si_3N_4$ | PECVD 13.56 MHz | 700° C. | 0.6 |
| $Si_3N_4$ | PECVD 50 kHz | 350° C. | −1.1 |

Figure 10:
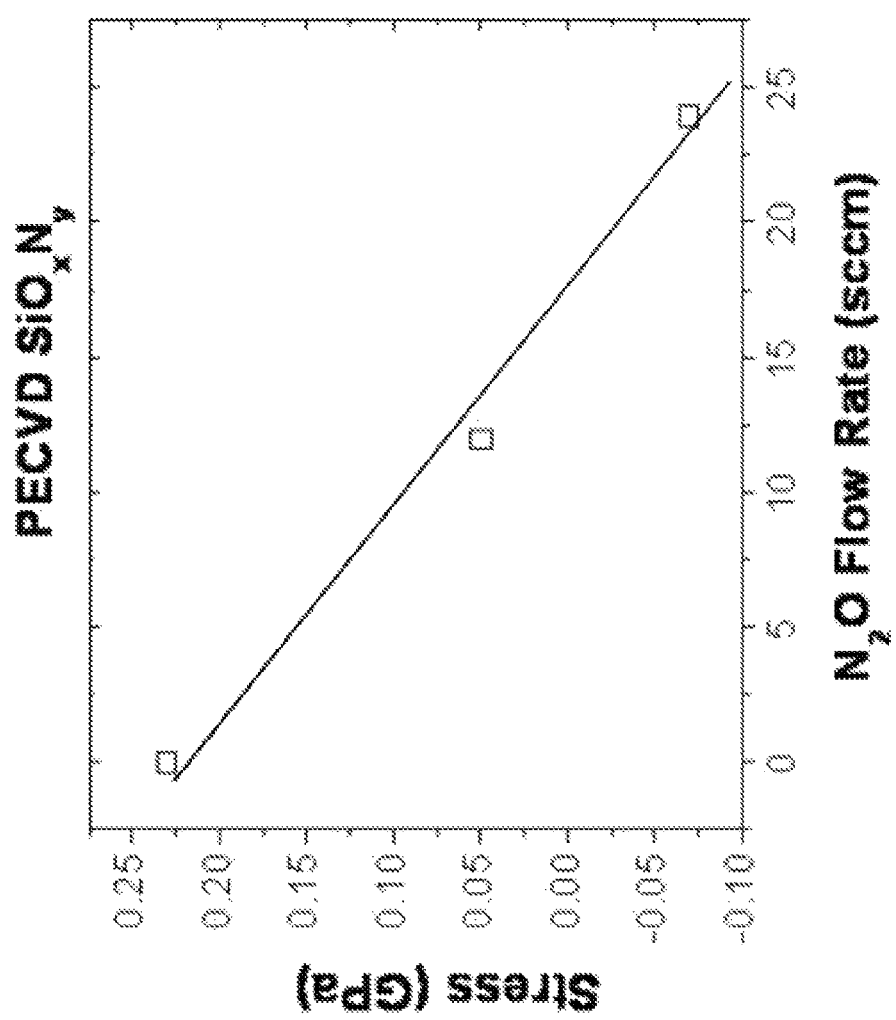
FIG. 10 shows a plot of the intrinsic stress of a $SiO_xN_y$ thin film deposited via plasma-enhanced CVD versus $N_2O$ flow rate.
Figure 11A:
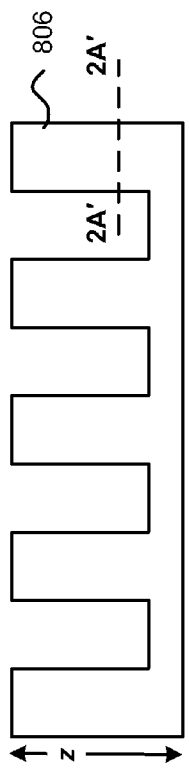
FIGS. 11A to 11G show schematics of various cross sectional shapes of three dimensional structures, according to some embodiments.
Figure 11D:
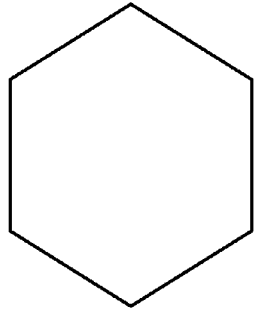
Figure 11C:
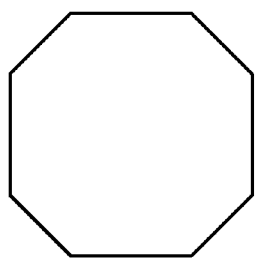
Figure 11B:
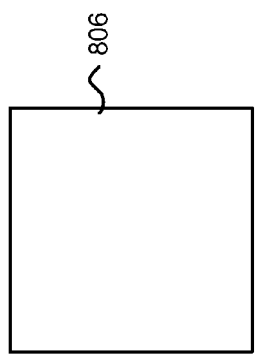
Figure 11G:
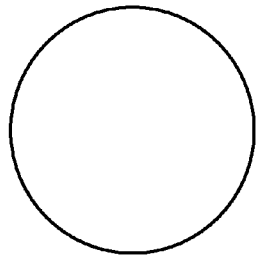
Figure 11F:
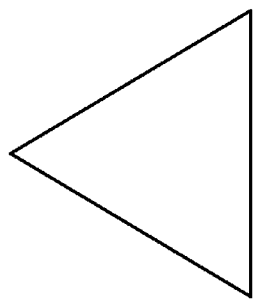
Figure 11E:
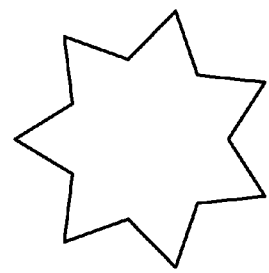

In some approaches where the thin film 810 comprises $SiO_2$, the thin film may have a physical characteristic of providing a compressive strain to the three dimensional structures 806. In other approaches where the thin film 810 comprises $SiN_{2x}$, the thin film may have a physical characteristic of providing a tensile strain to three dimensional structures 806. Consequently, tuning the relative amounts of oxygen and nitrogen in a $SiO_xN_y$ thin film present on three dimensional structure may modify the degree and type of strain induced in/applied to the three dimensional structures in various approaches. FIG. 10 illustrates a plot of the intrinsic stress of a $SiO_xN_y$ thin film deposited on such three dimensional structures via plasma-enhanced CVD versus $N_2O$ flow rate.

In yet another approach, the thin film 810 may have a dopant or additional element (designating a higher concentration) therein, e.g. an additive, where the dopant has a physical characteristic of further modifying a strain, e.g. a tensile and/or compressive strain, imposed on/induced in the three dimensional structures 806. For example, the dopant may modify the strain by changing the bonding configuration of the thin film 810 in some approaches. The dopant may include, but is not limited to, nitrogen, oxygen, carbon, hydrogen or other such suitable dopants as would be understood by one skilled in the art.

A second material may be optionally deposited in the above mentioned gaps to provide support to the pillar structure, in a further approach. Preferably, this second material may not impart significant additional strain to the array of three dimensional structures. This second material may be, for example, a non-rigid material, a polymer, etc. In preferred embodiments, the second material may be different from the material of the pillars 806 and/or the thin film 810. In addition, the second material may be deposited via chemical vapor deposition, spin coating, etc.

As mentioned above, the photolithographic mask 802 defines the geometry, arrangement and shape of each of the three dimensional structures 806 on the substrate 804. For example, as shown in FIGS. 11A-G according to some embodiments, illustrative cross sectional shapes of the three dimensional structures 806, as would be seen if viewed in a cross section along a plane (denoted by line 2A' in FIG. 11A) oriented perpendicular to its longitudinal axis (z), may include, but is not limited to, a square (FIG. 11B), octagon (FIG. 11C), hexagon (FIG. 11D), star (FIG. 11E), triangle (FIG. 11F), circle (FIG. 11G), etc., or other such suitable shapes. In some approaches, a three dimensional structure with a rounded cross sectional shape may be formed using a lithographic mask with the rounded feature therein. Alternatively, in other approaches, the lithographic mask may contain sharp corners thereby producing three dimensional structures with sharp corners that may subsequently be rounded, e.g., by overexposure during the lithographic exposure step, photoresist reflow, wet etching or plasma etching, etc.

Three dimensional structures with cross sectional shapes having sharp corners (e.g. square, octagon, star, triangle etc.) may create high stress fields, which, when coupled with the thin film (e.g. having intrinsic stresses) deposited in the cavity regions may induce a higher volumetric strain on the three dimensional structures relative to three dimensional structures having rounded corners. Thus, the geometry of the three dimensional structures may be formed and/or modified in order to achieve a specific type and/or amount of strain.

In addition, the geometry of the three dimensional structures may also affect one or more depositions conditions. For example, the deposition rate of the thin film may be faster on flat edges than corners, creating areas of concentrated strain (e.g. uneven strain gradients) on the three dimensional structures in other approaches.

Figure 12A:
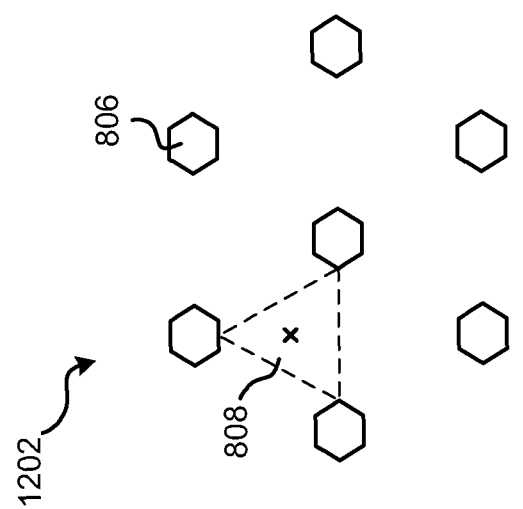
FIG. 12A shows a schematic of a hexagonally packed array, according to one embodiment.
Figure 12B:
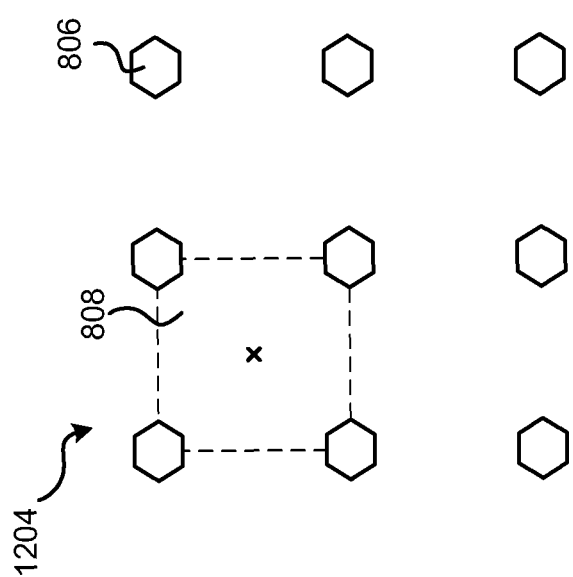
FIG. 12B shows a schematic of a square packed array, according to one embodiment.

In further approaches where the thin film is deposited in the cavity regions using a conformal coating method, such as chemical vapor deposition, areas of the array may fill faster or slower than others, leading to areas having more or less of a thin film coating relative to the other areas. This partial filling mechanism may also result in uneven strain gradients on the three dimensional structures, leading to large localized strains. Thus, in some embodiments, the three dimensional structures may be arranged in the array such that a separation between each of the three dimensional structures is about uniform. For instance, in one approach, the array of three dimensional structures may be arranged in a hexagonally close packed (HCP) array 1202 as shown in FIG. 12A. With a HCP array 1202, the cavity regions 808 between each three dimensional structure 806 may be conceptually thought of as sections each having a generally triangular cross sectional shape. An HCP array 1202 may provide a lower strain configuration than a square array 1204 in such approaches. Again, this reduction in induced strain may be because the distance between three dimensional structures is more uniform for the HCP array 1202 than the square array 1204 and because there is less of a gap in the center of the cavity regions 808 (represented as an "x" in FIG. 12) of the HCP array 1202 than the square array 1204.

In yet other embodiments, some or all of three dimensional structures may be arranged such that the separation between each of the three dimensional structures is not uniform. Deposition of the thin film to an array of pillars having a non-uniform separation therebetween may allow areas of the array to fill faster or slower than others, leading to areas having more or less of a thin film coating relative to the other areas. Such a configuration may thus create regions in the array with different strains. Accordingly, in more approaches, the geometry of the array, e.g. the separation between the three dimensional structures, may purposely be made "non-uniform" in order to create regions with different strains to achieve different device properties. In more approaches, the array may comprise a plurality of sections of three dimensional structures, where a separation between each of the three dimensional structures in each section is not uniform, and where some or all of the sections are characterized as having a different degree/amount and/or arrangement of non-uniformity from one another.

According to another embodiment, each of the three dimensional structures 806 may have a tapered profile, where an average diameter of an upper portion of the three dimensional structure (positioned away from the substrate 804) is smaller than the average diameter of a lower portion of the three dimensional structure (positioned toward the substrate 804). The diameters are oriented perpendicular to a longitudinal axis of the three dimensional structure 806. Furthermore, the diameter of each lower portion and the diameter of each upper portion may be about constant along the longitudinal axis of the associated three dimensional structure 806 in some approaches.

In numerous approaches, reducing the average diameter of the upper portion of the three dimensional structure relative to the lower portion may be achieved via known etching techniques. For example, in one embodiment utilizing a wet etching technique, application of a wet etchant to the three dimensional structures 806 without a surfactant may only isotropically wet etch the entrance (e.g. the upper portion) of the three dimensional structures 806. In more embodiments, the wet etch may be confined to the upper portions of the three dimensional structures 806 by adjusting the concentrations and temperature of the wet etchant. Additionally, at least the upper portions of the three dimensional structures 806 may include dopants (e.g. boron, phosphorus, arsenic, etc.) therein, which may modify the etch rate and/or aid in confining the etching to specific portions of the three dimensional structure 806. For example, in numerous approaches, the dopant may have a physical characteristic of increasing an etch rate of the upper portion of the three dimensional structures 806.

A tapered profile of the three dimensional structures may facilitate, allow, etc. a substantially conformal deposition of the thin film 810 in the cavity regions 808. Thus, such tapered profiles of the three dimensional structures, may prevent uneven strain gradients on the three dimensional structures (e.g. may prevent localized areas of high strain).

In one embodiment, the method 800 may also include determining whether a volumetric strain of the three dimensional structures 806 is about equal to or greater than a predetermined value and removing at least a portion of the thin film 810 upon determining that the volumetric strain is about equal to or greater than the predetermined value. Such a predetermined value may represent a threshold value, may be set by a user, may be calculated using a known algorithm, may be provided in a table, etc.

As mentioned previously, an intrinsic stress of the thin film 810 may be tuned, e.g. by altering the thickness of the thin film 810, by altering one or more deposition conditions, etc., thereby providing/inducing controllable strain on the three dimensional structures 806. Such tuning of the intrinsic stress of the thin film (and thus the strain applied to the three dimensional structures) may directly affect/alter fundamental physical and electronic properties of semiconductor material(s) present in the three dimensional structures. In some approaches, electronic properties of interest may be closely monitored and matched with the applied strain.

In more approaches, the amount of applied strain may be measured/characterized using various optical techniques, including but not limited to wafer curvature (e.g. laser interferometry), Raman spectroscopy, photo absorption/reflectance, photoluminescence, emission, etc.

In still more approaches, photocurrent measurements may be utilized to measure the band gap energy of strained and unstrained three dimensional semiconductor structures.

In additional approaches, the band gap energy of the three dimensional semiconductor structures may be characterized using current-voltage-temperature measurements. Three dimensional semiconductor structures, such as p-i-n diodes, typically operate under reverse bias. In some approaches, the presence of strain on said p-i-n diodes may alter the band gap, thereby modifying the reverse-bias current, which is dominated by band-to-band generation.

Uses

According to some embodiments of the invention, many beneficial uses may be derived. For example, some embodiments may allow tuning of fundamental optical and physical properties of three dimensional crystalline semiconductor structures via application of external strain in the form of non-crystalline thin film coatings. Such systems/devices and methods of making the same may allow for improved semiconductor/electronic/optoelectronic devices such as semiconductor lasers, light emitting diodes, laser diodes, electronic diodes, photodiodes, sensors, detectors (e.g. neutron detectors) etc.

Further, the embodiments disclosed herein may have useful applications in photovoltaics (e.g. solar cells). Specifically, various embodiments may be useful for both single and multi junction cells.

Figure 13:
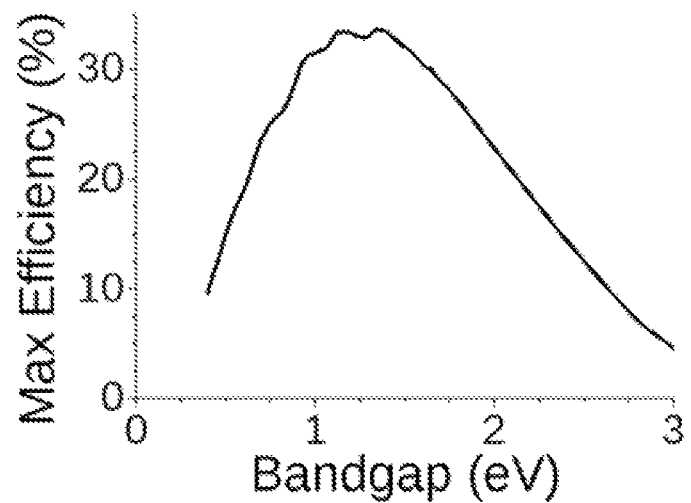
FIG. 13 shows a plot of the maximum efficiency of a solar cell using a p-n junction determined by the Shockley-Queisser limit.

The maximum efficiency of a solar cell using a p-n junction is determined by the Shockley-Queisser limit, as shown in FIG. 13. As show in FIG. 13, the maximum attainable efficiency is 33.7% at around 1.35 eV. In some approaches, application of an intrinsically strained dielectric film to a single junction photovoltaic cell comprising 3D semiconductor structures may shift the band gap of the single junction photovoltaic cell to an energy with higher efficiency (see, e.g. FIG. 13).

Figure 14:
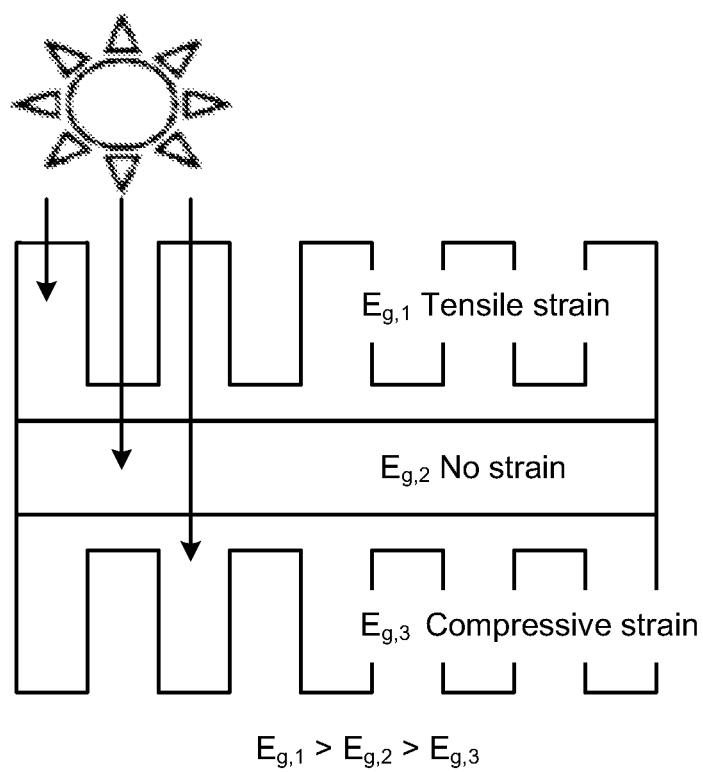
FIG. 14 shows a schematic of multi junction strained Photovoltaic cell comprising a single material, according to one embodiment.

In other approaches, multiple junctions made of different materials with carefully selected band gaps may break the Shockley-Queisser limit, allowing for a theoretical maximum efficiency of 68% in unconcentrated sunlight for an infinite layer cell. However, multi junction cells require epitaxial growth of various compound semiconductors. This is costly as well as limiting due to epitaxial requirements for quality films. As mentioned herein, the application of strain may shift the band gap of a semiconductor to a value that produces a higher efficiency, or may be used to produce a multi junction cell from a single material. For example, FIG. 14 illustrates a schematic of multi junction strained Photovoltaic cell comprising a single material, according to one embodiment. Accordingly, application of large amounts of strain to achieve relatively large band gap shifts may be achieved utilizing the 3D microstructured semiconductors coated with highly intrinsically strained dielectric films, such as those disclosed herein. These three dimensional microstructures may be etched into Si substrates, followed by deposition of dielectric films using chemical vapor deposition (CVD), plasma enhanced chemical vapor deposition (PECVD), etc. to achieve conformal coatings, in some approaches. Dielectrics may include $SiO_2$, $SiN_x$, B, etc. Deposition conditions may be tuned to achieve controllable strain, in preferred approaches. In additional approaches, the strain may be measured by Raman spectroscopy, current-voltage measurements, photocurrent measurements, etc.

Any of the methods, systems, devices, etc. described above, taken individually or in combination, in whole or in part, may be included in or used to make one or more systems, structures, etc. In addition, any of the features presented herein may be combined in any combination to create various embodiments, any of which fall within the scope of the present invention. Following are several examples of general and specific embodiments.

For example, in one embodiment an apparatus may include a three dimensional structure comprising a semiconductor material and at least one thin film coupled to/in contact with at least one exterior surface of the three dimensional structure for inducing a strain in the structure, the at least one thin film being characterized as providing at least one of: an induced strain of at least 0.05%, and an induced strain in at least 5% of a volume of the structure.

In another embodiment a bandgap of a bulk of the three dimensional structure may be affected by the induced stress rather than simply at an interface of a lattice mismatch, which induces only a local stress.

In yet another embodiment, the induced strain may be between 0.05 and 5%. In some approaches, the induced strain may be within 10% of a fracture point of the structure. In other approaches, the induced strain may be within 5% of the fracture point. In more approaches, the induced strain may be within 2% of the fracture point.

In even more approaches, the induced strain may be a tensile strain and/or a compressive strain.

In an additional embodiment, the induced strain may be in at least 75% of the volume of the structure, preferably in at least 80%. In various approaches, the induced strain may be in at least 90% of the volume of the structure. In even more approaches, the induced strain may be in 100% of the volume of the structure.

In yet further embodiments, at least one thin film may comprise intrinsic stress(es). In some approaches, at least one thin film may comprise an intrinsic stress greater than about 100 MPa. In other approaches, the thin film may comprise an intrinsic stress between about 1 GPa to about 5 GPa.

According to one embodiment, the semiconductor material may include a crystalline or amorphous material. In some approaches, the semiconductor material may include silicon. In other approaches, the semiconductor material may include a III-V material. In numerous approaches, the semiconductor material may be selected from a group consisting of Si, SiC, GaAs, AlGaAs, GaN, CdTe, and AlGaN.

According to another embodiment, the three dimensional structure may be a pillar. In some approaches, the three dimensional structure may be a ridge type structure. In more approaches, the three dimensional structure may be incorporated in an array of three dimensional structures.

According to yet another embodiment, the three dimensional structure may be comprise a cross sectional shape selected from the group consisting of: a circle, a rectangle, a square, an octagon, a hexagon, a triangle, and an ellipsoid, wherein the cross section is taken perpendicular to a longitudinal axis of the three dimensional structure.

According to an additional embodiment, at least one thin film may comprise a dielectric material. In some approaches the thin film may comprises a material selected from the group consisting of: $SiO_2$, $SiN_x$, $SiO_xN_y$, B and combinations thereof. In other approaches, the thin film may be a non-crystalline material. For example, in various approaches, the thin film may be amorphous. In more approaches, the thin film may be polycrystalline.

According to a further embodiment, the apparatus may be functional as at least one of a photovoltaic, a photodiode, a light emitting diode, a laser diode, and an electronic diode.

Additionally, in one embodiment, a method may include forming a three dimensional structure of a semiconductor material and depositing at least one thin film on at least one exterior surface of the three dimensional structure for inducing a strain in the structure, at least one thin film being characterized as providing at least one of: an induced strain of at least 0.05%, and an induced strain in at least 5% of a volume of the structure.

In some approaches, the at least one thin film may be deposited using a technique selected from at least one of: chemical vapor deposition, plasma-enhanced chemical vapor deposition, evaporation, atomic layer deposition, spin coating, spin coating with sintering, and sputtering.

In other approaches, the method may further include comprising modifying one or more deposition conditions to alter an intrinsic stress of the at least one thin film.

In more approaches, the method may also comprise determining whether the induced strain is about equal to or greater than a predetermined value, and removing at least a portion of at least one thin film upon determining that the induced strain of three dimensional structures is about equal to or greater than the predetermined value.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An apparatus, comprising:
   a substrate;
   an array of three dimensional semiconductor structures positioned above the substrate, wherein each three dimensional structure comprises a bottom surface, a top surface and at least one side surface connecting the bottom surface and the top surface;
   a cavity region between each of the three dimensional structures; and
   a thin film located in each cavity region and surrounding each side surface of each three dimensional structure, the thin film being configured to induce a volumetric strain in at least a portion of each three dimensional structure,
   wherein a separation between the three dimensional semiconductor structures is non-uniform.

2. The apparatus of claim 1, wherein the three dimensional structures have a pitch in a range from about 10 nm to about 10 µm.

3. The apparatus of claim 1, wherein a thickness of the thin film is less than a height of each three dimensional semiconductor structure, wherein the thickness of the thin film and the height of each three dimensional semiconductor structure is measured in a direction perpendicular to a plane extending along the bottom surfaces of the three dimensional semiconductor structures.

4. The apparatus of claim 1, wherein the thin film comprises a material selected from the group consisting of: B, $Al_2O_3$, $TiO_2$, $Ta_2O_5$, a metal, and combinations thereof.

5. The apparatus of claim 4, wherein the thin film comprises a dopant, the dopant comprising at least one of: carbon and hydrogen.

6. The apparatus of claim 1, wherein a bandgap of a bulk of the three dimensional structures is affected by the induced volumetric strain.

7. The apparatus of claim 1, wherein the induced volumetric strain is within 10% of a fracture point of the three dimensional structures.

8. The apparatus of claim 1, wherein the induced strain is in at least 50% of the volume of the three dimensional structures.

9. The apparatus of claim 1, wherein the induced strain is in at least 90% of a volume of the three dimensional structures.

10. The apparatus of claim 1, wherein each three dimensional structure has an upper portion and a lower portion, wherein the upper portion has a smaller average diameter relative to an average diameter of the lower portion, wherein the diameters are measured parallel to the bottom surface of the three dimensional structure.

11. The apparatus of claim 1, wherein the array comprises a semiconductor material including a III-V or II-VI material.

12. The apparatus of claim 1, wherein the induced strain is between 0.05 and 5%.

13. The apparatus of claim 1, wherein at least some of the three dimensional structures each comprise a pillar having a rounded cross sectional shape, the cross section being taken perpendicular to a longitudinal axis of the pillar.

14. The apparatus of claim 1, wherein at least some of the three dimensional structures each comprise a cross sectional shape selected from the group consisting of: a circle, a rectangle, a square, an octagon, a hexagon, a triangle, and an ellipsoid, wherein the cross section is taken perpendicular to a longitudinal axis of the three dimensional structure.

15. The apparatus of claim 1, wherein the thin film comprises a dielectric material.

16. The apparatus of claim 1, wherein the thin film comprises a material selected from the group consisting of: $SiO_2$, $SiN_x$, $SiO_xN_y$, B, and combinations thereof.

17. The apparatus of claim 1, wherein the thin film is non-crystalline.

18. The apparatus of claim 1, wherein the apparatus is functional as at least one of a photovoltaic, a photodiode, a light emitting diode, a laser diode, and an electronic diode.

19. The apparatus of claim 1, wherein the induced-strain is a tensile strain and/or compressive strain.

* * * * *